(12) United States Patent
Higashika

(10) Patent No.: US 10,367,170 B2
(45) Date of Patent: Jul. 30, 2019

(54) LIGHT EMITTING DEVICE WITH IRREGULARITIES LOCATED ON A FIRST LIGHT TRANSMISSIVE SUBSTRATE AND A SECOND LIGHT TRANSMISSIVE SUBSTRATE

(71) Applicant: PIONEER CORPORATION, Kawasaki-shi, Kanagawa (JP)

(72) Inventor: Yasunobu Higashika, Kawasaki (JP)

(73) Assignee: PIONEER CORPORATION, Kawasaki-Shi, Kanagawa (JP)

( * ) Notice: Subject to any disclaimer, the term of this patent is extended or adjusted under 35 U.S.C. 154(b) by 1 day.

(21) Appl. No.: 15/662,196

(22) Filed: Jul. 27, 2017

(65) Prior Publication Data

US 2017/0324066 A1    Nov. 9, 2017

Related U.S. Application Data

(63) Continuation of application No. 14/985,194, filed on Dec. 30, 2015, now Pat. No. 9,748,525, which is a
(Continued)

(51) Int. Cl.
*H01L 29/08* (2006.01)
*H01L 51/52* (2006.01)
(Continued)

(52) U.S. Cl.
CPC ...... *H01L 51/5275* (2013.01); *H01L 51/0096* (2013.01); *H01L 51/0097* (2013.01);
(Continued)

(58) Field of Classification Search
CPC ...... H05B 33/00; B42D 25/342; G02B 27/22; G02B 3/00; G02B 5/09; G02B 27/60
(Continued)

(56) References Cited

U.S. PATENT DOCUMENTS

| 5,724,108 A | 3/1998 | Shibata et al. |
| 7,541,671 B2 | 6/2009 | Foust et al. |

(Continued)

FOREIGN PATENT DOCUMENTS

| JP | 2005063926 A | 3/2005 |
| JP | 2005322490 A | 11/2005 |

(Continued)

OTHER PUBLICATIONS

International Search Report for PCT/JP2012/082773 dated Mar. 5, 2013.

(Continued)

*Primary Examiner* — Caleb E Henry
(74) *Attorney, Agent, or Firm* — Procopio, Cory, Hargreaves & Savitch LLP

(57) ABSTRACT

A first electrode having light transmissivity is formed on a first surface of a first light transmissive substrate and. An organic functional layer includes a light-emitting layer and is located on an opposite side to the first light transmissive substrate with the first electrode interposed therebetween. A second electrode is located on an opposite side to the first electrode with the organic functional layer interposed therebetween. A second surface which is a surface of the first light transmissive substrate on an opposite side to the above-mentioned first surface is fixed to the second light transmissive substrate, which has a bending rigidity higher than that of the first light transmissive substrate. First irregularities are present in the second surface of the first light transmissive substrate, and second irregularities are positioned in a surface of the second light transmissive substrate which faces the first light transmissive substrate.

19 Claims, 6 Drawing Sheets

Related U.S. Application Data continuation of application No. 14/653,239, filed as application No. PCT/JP2012/082773 on Dec. 18, 2012, now Pat. No. 9,257,676.

(51) Int. Cl.
    *H01L 51/00* (2006.01)
    *H01L 51/50* (2006.01)

(52) U.S. Cl.
    CPC ........ *H01L 51/504* (2013.01); *H01L 51/5088* (2013.01); *H01L 51/5092* (2013.01); *H01L 51/52* (2013.01); *H01L 51/5215* (2013.01); *H01L 51/5231* (2013.01); *H01L 51/5268* (2013.01); *H01L 51/5212* (2013.01); *H01L 2251/308* (2013.01); *H01L 2251/5338* (2013.01); *Y02E 10/549* (2013.01)

(58) Field of Classification Search
    USPC .................................. 359/619, 627; 257/40
    See application file for complete search history.

(56) References Cited

U.S. PATENT DOCUMENTS

| | | |
|---|---|---|
| 7,722,929 B2 | 5/2010 | Aitken et al. |
| 7,733,018 B2 | 6/2010 | Handa et al. |
| 7,816,844 B2 | 10/2010 | Cha et al. |
| 7,842,376 B2 | 11/2010 | Lu |
| 8,033,706 B1 | 10/2011 | Kelly et al. |
| 8,164,726 B2 | 4/2012 | Egi et al. |
| 8,173,995 B2 | 5/2012 | Ramakrishnan et al. |
| 8,247,820 B2 | 8/2012 | Kostka |
| 8,389,983 B2 | 3/2013 | Seo et al. |
| 8,530,908 B2 | 9/2013 | Ishizuya |
| 8,685,768 B2 | 4/2014 | Huh et al. |
| 8,754,434 B1 | 6/2014 | Gollier et al. |
| 8,779,424 B2 | 7/2014 | Matsuzaki |
| 8,859,309 B2 | 10/2014 | Shin |
| 8,941,141 B2 | 1/2015 | Chen et al. |
| 9,050,622 B2 | 6/2015 | Aitken et al. |
| 2002/0008807 A1 | 1/2002 | Miyatake et al. |
| 2003/0184219 A1 | 10/2003 | Duggal et al. |
| 2004/0000865 A1 | 1/2004 | Yamazaki |
| 2004/0027672 A1 | 2/2004 | Bourdelais et al. |
| 2004/0031977 A1 | 2/2004 | Brown et al. |
| 2004/0046497 A1 | 3/2004 | Schaepkens et al. |
| 2004/0211971 A1 | 10/2004 | Takei et al. |
| 2004/0227446 A1 | 11/2004 | Fujimoto et al. |
| 2004/0227462 A1 | 11/2004 | Utsumi et al. |
| 2004/0241421 A1 | 12/2004 | Ootsuka et al. |
| 2004/0247875 A1 | 12/2004 | Ootsuka et al. |
| 2004/0263061 A1 | 12/2004 | Ishikawa et al. |
| 2005/0007793 A1 | 1/2005 | Yoshida et al. |
| 2005/0023974 A1 | 2/2005 | Chwang et al. |
| 2005/0073228 A1 | 4/2005 | Tyan et al. |
| 2005/0224935 A1 | 10/2005 | Schaepkens et al. |
| 2005/0248268 A1 | 11/2005 | Hardinger et al. |
| 2006/0066228 A1 | 3/2006 | Antoniadis et al. |
| 2006/0067078 A1 | 3/2006 | Beeson |
| 2006/0192483 A1 | 8/2006 | Nakanishi et al. |
| 2006/0208634 A1 | 9/2006 | Schaepkens et al. |
| 2006/0263606 A1 | 11/2006 | Aberle et al. |
| 2007/0131928 A1 | 6/2007 | Kwak et al. |
| 2008/0037126 A1 | 2/2008 | Kitamura et al. |
| 2008/0100202 A1 | 5/2008 | Cok |
| 2008/0143560 A1 | 6/2008 | Shipman |
| 2008/0203421 A1 | 8/2008 | Bechtel et al. |
| 2010/0046236 A1 | 2/2010 | Nishiwaki |
| 2010/0110675 A1 | 5/2010 | Van Herpen et al. |
| 2010/0207520 A1 | 8/2010 | Zhu et al. |
| 2011/0025191 A1 | 2/2011 | Xu et al. |
| 2011/0080738 A1 | 4/2011 | Wakabayashi et al. |
| 2011/0090697 A1 | 4/2011 | Matsuzaki et al. |
| 2011/0133624 A1 | 6/2011 | Wakabayashi et al. |
| 2012/0049170 A1 | 3/2012 | Yamae et al. |
| 2012/0063145 A1 | 3/2012 | Matsuzaki et al. |
| 2012/0119641 A1 | 5/2012 | Shi et al. |
| 2012/0161115 A1 | 6/2012 | Yamazaki et al. |
| 2012/0183734 A1 | 7/2012 | Schiavoni et al. |
| 2012/0187435 A1 | 7/2012 | Gy et al. |
| 2012/0252211 A1 | 10/2012 | Meulen et al. |
| 2012/0255673 A1 | 10/2012 | Stouwdam et al. |
| 2013/0181241 A1 | 7/2013 | Meulen et al. |
| 2014/0139410 A1 | 5/2014 | Peeters |
| 2014/0160552 A1 | 6/2014 | Seong et al. |
| 2014/0177025 A1 | 6/2014 | Lee et al. |
| 2015/0124480 A1 | 5/2015 | Baker et al. |
| 2015/0144928 A1 | 5/2015 | Forrest et al. |
| 2015/0171370 A1 | 6/2015 | Ehrensperger et al. |

FOREIGN PATENT DOCUMENTS

| | | |
|---|---|---|
| JP | 2008066027 A | 3/2008 |
| JP | 2010129184 A | 6/2010 |

OTHER PUBLICATIONS

High-Efficiency White OLEDs with Built-Up Outcoupling Substrate, p. 694-p. 697, SID 2012 Digest.

(a)

(b)

LIGHT EMITTING DEVICE WITH IRREGULARITIES LOCATED ON A FIRST LIGHT TRANSMISSIVE SUBSTRATE AND A SECOND LIGHT TRANSMISSIVE SUBSTRATE

This continuation application claims the benefit of U.S. application Ser. No. 14/985,194 filed Dec. 30, 2015 which is a continuation application of U.S. application Ser. No. 14/653,239, filed Jun. 17, 2015, U.S. Pat. No. 9,257,676 issued Feb. 9, 2016, which is a 371 of PCT/JP2012/082773, filed Dec. 18, 2012, the disclosures of which are hereby incorporated by reference in their entirety.

TECHNICAL FIELD

The present invention relates to a light-emitting device.

BACKGROUND ART

One of light-emitting devices is a light-emitting device using an organic electroluminescence (EL). One of the problems of such a light-emitting device is the need to improve the ratio of light generated by an organic EL and emitted to the outside (light extraction efficiency).

For example, Non-Patent Document 1 discloses that irregularities are formed in a surface of a plastic film which faces a glass substrate when the plastic film having an organic layer formed thereon is mounted on the glass substrate.

RELATED DOCUMENT

Non-Patent Document

[Non-Patent Document 1] Kazuyuki Yamae, et al., "High-Efficiency White OLEDs with Built-up Outcoupling Substrate", P694, SID 2012 DIGEST

SUMMARY OF THE INVENTION

In the structure disclosed in Non-Patent Document 1, when a first substrate (for example, a film) having an organic layer formed thereon is attached to a second substrate (for example, a glass substrate) which has a bending rigidity higher than that of the first substrate, the first substrate may be bent. The inventors considered that there is the possibility of in-plane variation occurring in the amount of light emission in this case due to the bending of the first substrate. A problem that the invention is to solve includes an example in which in-plane variation in the amount of light emission of a light-emitting device is reduced.

According to an aspect of the invention, there is provided a light-emitting device including a first light transmissive substrate; a first electrode that is formed on a first surface of the first light transmissive substrate and has light transmissivity; an organic functional layer that is located on an opposite side to the first light transmissive substrate with the first electrode interposed therebetween and includes a light-emitting layer; a second electrode that is located on an opposite side to the first electrode with the organic functional layer interposed therebetween; and a second light transmissive substrate to which a second surface which is a surface of the first light transmissive substrate on an opposite side to the first surface is fixed, and which has a bending rigidity higher than that of the first light transmissive substrate. A plurality of first irregularities are formed in the second surface of the first light transmissive substrate. A plurality of second irregularities are formed in a surface of the second light transmissive substrate which faces the first light transmissive substrate.

BRIEF DESCRIPTION OF THE DRAWINGS

The above-described objects, other objects, features and advantages will become more apparent from the preferred embodiments described below, and the accompanying drawings as follows.

DESCRIPTION OF EMBODIMENTS

Figure 1:
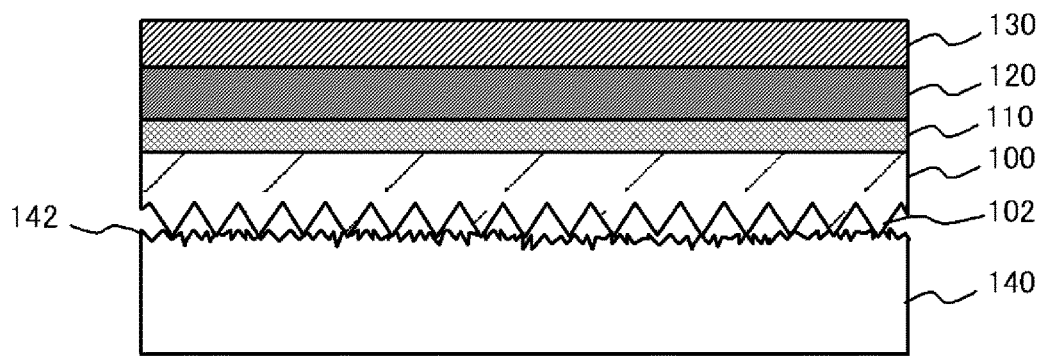
FIG. 1 is a cross-sectional view illustrating the configuration of a light-emitting device according to an embodiment.

Hereinafter, embodiments of the invention will be described with reference to the accompanying drawings. In all the drawings, like reference numerals denote like components, and a description thereof will not be repeated. In addition, transmissivity in the following description means that at least a portion of light emitted by a light-emitting layer included in an organic functional layer 120 is transmitted.

FIG. 1 is a cross-sectional view illustrating the configuration of a light-emitting device 10 according to an embodiment. The light-emitting device 10 includes a first light transmissive substrate 100, a first electrode 110, an organic functional layer 120, a second electrode 130, and a second light transmissive substrate 140. The first electrode 110 is formed on the first surface side of the first light transmissive substrate 100 and has light transmissivity. The organic functional layer 120 is located on the opposite side to the first light transmissive substrate 100 with the first electrode 110 interposed therebetween. The organic functional layer 120 includes a light-emitting layer. The second electrode 130 is located on the opposite side to the first electrode 110 with the organic functional layer 120 interposed therebetween. A second surface of the first light transmissive substrate 100 which is a surface on the opposite side to the above-mentioned first surface is fixed to the second light transmissive substrate 140. The bending rigidity of the second light transmissive substrate 140 is higher than that of the first light transmissive substrate. A plurality of first irregularities 102 are formed in the second surface of the first light transmissive substrate 100, and a plurality of second irregularities 142 are formed in a surface of the second light transmissive substrate 140 which faces the first light transmissive substrate 100. In the present embodiment, light emitted by the organic functional layer 120 is extracted from the second light transmissive substrate 140 side.

For example, the first irregularities 102 are formed with regularity. For example, the first irregularities 102 are formed by arranging a plurality of polygonal pyramids and polygonal columns. On the other hand, it is preferable that the second irregularities 142 do not have regularity. That is, it is preferable that intervals between the vertexes of the second irregularities 142 are dispersed more widely than intervals between the vertexes of the first irregularities 102. In addition, it is preferable that the intervals between the vertexes of the second irregularities 142 are narrower than the intervals between the vertexes of the first irregularities 102.

In addition, it is preferable that the depth (difference in height between the apex and the bottom) of the second irregularity 142 is smaller than the depth of the first irregularity 102. For example, the depth of the first irregularity 102 is equal to or greater than 1 µm and equal to or less than 200 µm, and the depth of the second irregularity 142 is equal to or greater than 0.2 µm and equal to or less than 10 µm.

In the present embodiment, it is preferable that the first light transmissive substrate 100 has flexibility. The first light transmissive substrate 100 is an insulating film such as, for example, a resin film. When the first light transmissive substrate 100 is a resin film, a resin constituting the first light transmissive substrate 100 is, for example, polyethylene terephthalate (PET), poly ether sulfone (PES), or polyethylene naphthalate (PEN), but the invention is not limited thereto.

The first electrode 110 is a transparent electrode formed of, for example, indium thin oxide (ITO) or indium zinc oxide (IZO). Here, the first electrode 110 may be a thin metal film such that light passes therethrough. A difference between a refractive index $n_1$ of the first electrode 110 and a refractive index $n_2$ of the first light transmissive substrate 100 is, for example, equal to or less than 0.5. That is, the relation of $(n_1-0.5) \leq n_2 \leq (n_1+0.5)$ is satisfied. Meanwhile, it is preferable that $n_1$ is equal to $n_2$. Meanwhile, the relation of $(n_1-0.2) \leq n_2 \leq (n_1+0.2)$ may be satisfied. Meanwhile, refractive indexes of PET, PES, and PEN are 1.6, 1.7, and 1.8, respectively. In addition, refractive indexes of ITO and IZO are approximately 1.8 to 2.0.

The organic functional layer 120 includes at least a hole injection layer, a light-emitting layer, and an electron injection layer. Each layer of the organic functional layer 120 may be formed by a deposition method, or may be formed by a coating method (including an ink jet method).

The second electrode 130 is a metal film such as, for example, an Ag film or an Al film.

The second light transmissive substrate 140 is, for example, a glass substrate or a resin substrate. A refractive index $n_3$ of the second light transmissive substrate 140 is lower than the refractive index $n_2$ of the first light transmissive substrate 100. Here, the refractive index $n_3$ may be nearly equal to the refractive index $n_2$. A refractive index of glass used for a glass substrate is, for example, 1.5.

Figure 2:
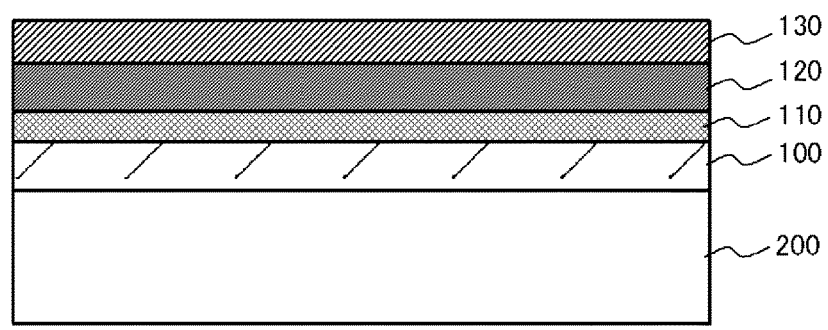
FIG. 2 are cross-sectional views illustrating a method of manufacturing the light-emitting device illustrated in FIG. 1.
Figure 2:
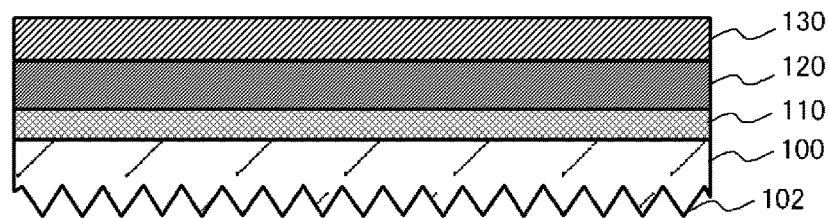

FIG. 2 are cross-sectional views illustrating a method of manufacturing the light-emitting device 10 illustrated in FIG. 1. First, as illustrated in FIG. 2(a), the first light transmissive substrate 100 is mounted on a support base 200. Subsequently, the first electrode 110 is formed on the first surface of the first light transmissive substrate 100. Next, the organic functional layer 120 is formed on the first electrode 110. Then, the second electrode 130 is formed on the organic functional layer 120.

Thereafter, as illustrated in FIG. 2(b), the first light transmissive substrate 100 is removed from the top of the support base 200. Then, the first irregularities 102 are formed in the second surface of the first light transmissive substrate 100. For example, the first irregularities 102 are formed by pressing a mold against the second surface of the first light transmissive substrate 100. Meanwhile, a layer for forming the first irregularities 102 may be provided on the second surface of the first light transmissive substrate 100. In addition, the first irregularities 102 may be formed before the first electrode 110 is formed on the first surface of the first light transmissive substrate 100.

Apart from the above-mentioned process, the second irregularities 142 are formed in a surface of the second light transmissive substrate 140 on which the first light transmissive substrate 100 is mounted. The second irregularities 142 are formed using, for example, sand blasting or etching. The first light transmissive substrate 100 is then mounted on the second light transmissive substrate 140 in which the second irregularities 142 are formed, using an adhesive or the like.

Next, operations and effects of the present embodiment will be described. According to the present embodiment, the first irregularities 102 are formed in the second surface of the first light transmissive substrate 100. The first irregularities 102 are formed, and thus light emitted by the light-emitting layer of the organic functional layer 120 is easily emitted to the outside from the first light transmissive substrate 100 even in a case where the refractive index of the first light transmissive substrate 100 is higher than the refractive index of the second light transmissive substrate 140 and a case where a difference between the refractive index of the first light transmissive substrate 100 and the refractive index of the first electrode 110 is equal to or less than 0.5.

On the other hand, when the first light transmissive substrate 100 is attached to the second light transmissive substrate 140, the first light transmissive substrate 100 may be bent. In this case, the uniformity of the organic functional layer 120 on the first light transmissive substrate 100 is reduced, and thus there is the possibility of in-plane variation occurring in light extracted from the first light transmissive substrate 100. This possibility becomes higher particularly when the first light transmissive substrate 100 is a film.

On the other hand, in the present embodiment, the second irregularities 142 are formed in a surface of the second light transmissive substrate 140 which faces the first light transmissive substrate 100. For this reason, even when in-plane variation occurs in light extracted from the first light transmissive substrate 100, the variation is reduced when light passes through the second irregularities 142. Therefore, it is possible to suppress the occurrence of in-plane variation in light extracted from the light-emitting device 10. In addition, even when a Moire pattern is generated in light emitted from the first light transmissive substrate 100, the Moire pattern becomes inconspicuous when the light passes through the second light transmissive substrate 140.

In addition, the second irregularities 142 are formed, and thus an incident angle of light is not likely to exceed a critical angle when light emitted from the first light transmissive substrate 100 is incident on the second light transmissive substrate 140. Therefore, the light extraction efficiency of the light-emitting device 10 is improved.

In addition, when intervals between the vertexes of the second irregularities 142 are dispersed more widely than intervals between the vertexes of the first irregularities 102, the above-mentioned effects are particularly remarkable.

In addition, when the intervals between the vertexes of the second irregularities 142 are narrower than the intervals between the vertexes of the first irregularities 102, in-plane variation in the amount of light which cannot be completely reduced when the light passes through the first irregularities 102 can be reduced when the light passes through the second irregularities 142. Accordingly, it is possible to further suppress the occurrence of in-plane variation in light extracted from the light-emitting device 10.

EXAMPLES

Example 1

Figure 3:
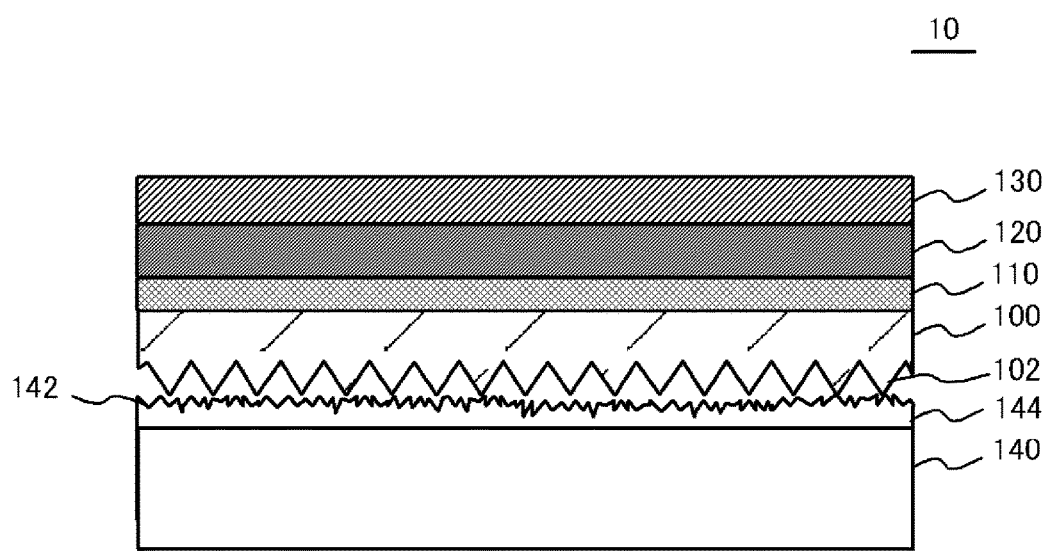
FIG. 3 is a cross-sectional view illustrating the configuration of a light-emitting device according to Example 1.

FIG. 3 is a cross-sectional view illustrating the configuration of a light-emitting device 10 according to Example 1. The light-emitting device 10 according to Example 1 has the same configuration as that of the light-emitting device 10 described in the embodiment except that a second light transmissive substrate 140 includes an irregularity formation layer 144.

The irregularity formation layer 144 is formed in a surface of the second light transmissive substrate 140 which faces the first light transmissive substrate 100. Second irregularities 142 are formed in the irregularity formation layer 144. For example, the irregularity formation layer 144 may be a film having the second irregularities 142, may be a layer obtained by firing glass paste, or may be a layer obtained by fixing inorganic particles (for example, $SiO_2$ particles) to one surface of the second light transmissive substrate 140. When a film is used as the irregularity formation layer 144, a material of the film is a resin such as, for example, PET, PES, or PEN. It is preferable that a refractive index of the irregularity formation layer 144 is lower than a refractive index of the first light transmissive substrate 100.

According to the present example, the same effects as in the embodiment described above can be obtained. In addition, since the second irregularities 142 are formed in the irregularity formation layer 144, it is possible to easily form the second irregularities 142.

Example 2

Figure 4:
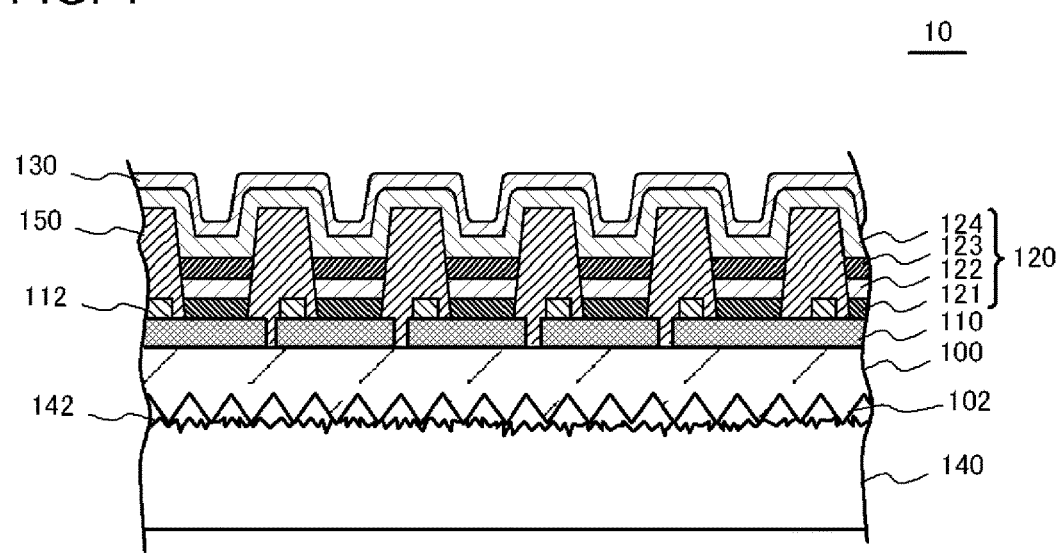
FIG. 4 is a cross-sectional view illustrating the configuration of a light-emitting device according to Example 2.

FIG. 4 is a cross-sectional view illustrating the configuration of a light-emitting device 10 according to Example 2. The light-emitting device 10 according to the present example has the same configuration as that of the light-emitting device 10 described in the embodiment except in the following respects.

First, an organic functional layer 120 is configured such that a hole injection layer 121, a hole transport layer 122, a light-emitting layer 123, and an electron injection layer 124 are laminated in this order.

In addition, the laminated structure of a first electrode 110, the hole injection layer 121, the hole transport layer 122, and the light-emitting layer 123 is divided into a plurality of regions. In detail, these laminated structures extend in parallel with each other in a direction perpendicular to the paper. The adjacent laminated structures are separated from each other by a partition wall 150. The partition wall 150 is a photosensitive resin such as, for example, polyimide and is formed in a desired pattern by exposure and development. Meanwhile, the partition wall 150 may be a resin other than polyimide, for example, an epoxy resin or an acrylic resin.

The light-emitting layers 123 adjacent to each other have different emission spectra, for example, different maximum peak wavelengths. Specifically, as the light-emitting layer 123, a layer emitting red light, a layer emitting green light, and a layer emitting blue light are repeatedly disposed. For this reason, in the light-emitting device 10, a linear region emitting red light, a linear region emitting green light, and a linear region emitting blue light are repeatedly disposed when seen in a plan view.

On the other hand, the electron injection layer 124 and the second electrode 130 are formed as common electrodes in the plurality of light-emitting layers 123 and are also formed on the partition wall 150.

In addition, a portion of the first electrode 110 is covered with the partition wall 150. An auxiliary electrode 112 is formed in the portion of the first electrode 110 which is covered with the partition wall 150. The auxiliary electrode 112 is formed using a metal such as, for example, Ag or Al, and has resistance lower than that of the first electrode 110. The auxiliary electrode 112 functions as an auxiliary electrode for lowering the apparent resistance of the first electrode 110.

Also in the present example, the same effects as in the embodiment described above can be obtained. In addition, it is possible to cause the light-emitting device 10 to emit light with a desired color tone by selecting the first electrode 110 to be connected to a power supply and controlling the amount of power which is to be input to the selected first electrode 110.

Meanwhile, in the present example, the light-emitting layer 123 may be configured to emit a single luminescent color such as white by mixing materials for emitting a plurality of colors of light, or may have a configuration in which a plurality of layers which emit different colors of light (for example, a layer emitting red light, a layer emitting green light, and a layer emitting blue light) are laminated.

Example 3

Figure 5:
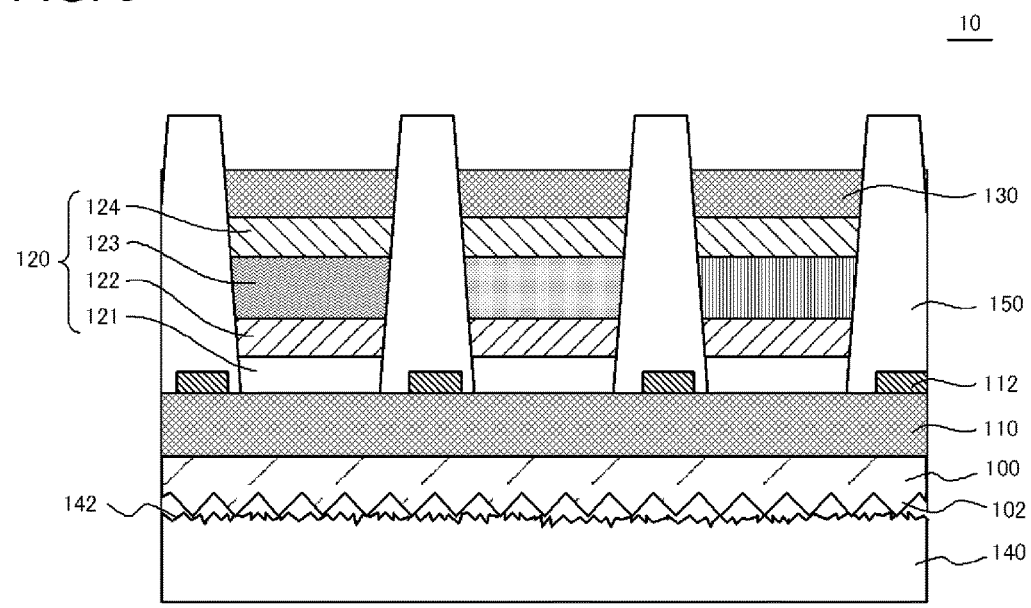
FIG. 5 is a cross-sectional view illustrating the configuration of a light-emitting device according to Example 3.

FIG. 5 is a cross-sectional view illustrating the configuration of a light-emitting device 10 according to Example 3. The light-emitting device 10 according to the present example has the same configuration as that of the light-emitting device 10 according to Example 2 except that a first electrode 110 serves as a common electrode and an organic functional layer 120 serves as an electrode for each light-emitting region. In detail, an electron injection layer 124 and a second electrode 130 are individually provided in a plurality of light-emitting layers 123, and the first electrode 110 serves as a common electrode in the plurality of light-emitting layers 123.

Also in the present example, the same effects as in Example 2 can be obtained.

Example 4

Figure 6:
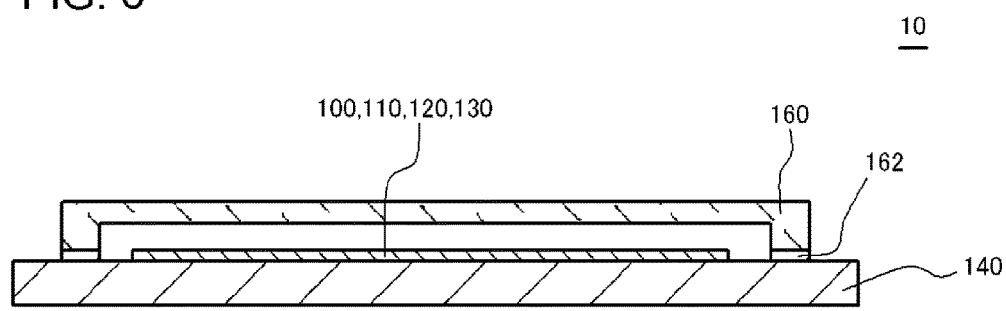
FIG. 6 is a cross-sectional view illustrating the configuration of a light-emitting device according to Example 4.

FIG. 6 is a cross-sectional view illustrating the configuration of a light-emitting device 10 according to Example 4. The light-emitting device 10 according to the present example has the same configuration as anyone of the light-emitting device 10 described in the embodiment and the light-emitting devices 10 according to Example 1 to Example 3 except that the light-emitting device includes a sealing member 160.

In detail, the planar shape of a second light transmissive substrate 140 is larger than the planar shape of a first light transmissive substrate 100. The second light transmissive substrate 140 protrudes from the whole circumference of the first light transmissive substrate 100 when seen in a plan view. The sealing member 160 seals the first light transmissive substrate 100, a first electrode 110, an organic functional layer 120, and a second electrode 130 between itself and the second light transmissive substrate 140.

The sealing member 160 is formed of quartz, glass, a metal, or a resin such as plastic, for example. The sealing member 160 has a shape in which an edge of a flat plate is bent at approximately 90 degrees toward the second light transmissive substrate 140. In the sealing member 160, an end face of the bent portion is fixed to the second light transmissive substrate 140 through an adhesive layer 162. Meanwhile, a specific gas or liquid is filled in the space surrounded by the sealing member 160 and the second light transmissive substrate 140.

Also in the present example, the same effects as in any one of the embodiment and Example 1 to Example 3 can be obtained. In addition, it is possible to seal the first light transmissive substrate 100 and the laminated body located thereon while obtaining these effects.

Although the embodiment and the examples have been described so far with reference to the accompanying drawings, these are merely illustrative of the invention, and various other configurations may be adopted.

The invention claimed is:

1. A light-emitting device comprising:
a first light transmissive substrate comprising a first surface and a second surface;
an organic functional layer that is located on the side of the first surface and includes a light-emitting layer; and
a second light transmissive substrate that is located on the side of the second surface, with the second light transmissive substrate, the first light transmissive substrate and the organic functional layer being arranged in this order in a thickness direction of the light-emitting device,
wherein a plurality of first irregularities are located on the second surface, and a plurality of second irregularities are located on a surface of the second light transmissive substrate, and intervals between vertexes of the second irregularities are narrower than intervals between the vertexes of the first irregularities.

2. The light-emitting device according to claim 1, wherein dispersion of intervals between vertexes of the second irregularities is larger than dispersion of intervals between vertexes of the first irregularities.

3. The light-emitting device according to claim 1, wherein an interface between the first irregularities and the second irregularities includes one or more voids.

4. The light-emitting device according to claim 3, wherein the one or more voids comprise a volume formed between the first irregularity and the second irregularity.

5. The light-emitting device according to claim 1, wherein first irregularities are positioned with regularity.

6. The light-emitting device according to claim 1, wherein one or more vertexes of one or more of the first irregularities are in contact with the surface of the second light transmissive substrate.

7. The light-emitting device according to claim 1, wherein the plurality of second irregularities are located directly on the surface of the second light transmissive substrate.

8. The light-emitting device according to claim 1, wherein the first light transmissive substrate is insulator.

9. The light-emitting device according to claim 1, wherein a first electrode is located between the first light transmissive substrate and the organic functional layer.

10. A light-emitting device comprising:
a first light transmissive substrate comprising a first surface and a second surface;
an organic functional layer that is located on the side of the first surface and includes a light-emitting layer; and
a second light transmissive substrate that is located on the side of the second surface, with the second light transmissive substrate, the first light transmissive substrate and the organic functional layer being arranged in this order in a thickness direction of the light-emitting device,
wherein a plurality of first irregularities are located on the second surface, and a plurality of second irregularities are located on a surface of the second light transmissive substrate, wherein
the second light transmissive substrate has a bending rigidity higher than that of the first light transmissive substrate.

11. The light-emitting device according to claim 10, wherein
an interface between the first irregularities and the second irregularities includes one or more voids.

12. The light-emitting device according to claim 11, wherein the one or more voids comprise a volume formed between the first irregularity and the second irregularity.

13. The light-emitting device according to claim 10, wherein
first irregularities are positioned with regularity.

14. The light-emitting device according to claim 10, wherein
one or more vertexes of one or more of the first irregularities are in contact with the surface of the second light transmissive substrate.

15. A light-emitting device comprising:
a first light transmissive substrate comprising a first surface and a second surface;
an organic functional layer that is located on the side of the first surface and includes a light-emitting layer; and
a second light transmissive substrate that is located on the side of the second surface, with the second light transmissive substrate, the first light transmissive substrate and the organic functional layer being arranged in this order in a thickness direction of the light-emitting device,
wherein a plurality of first irregularities are located on the second surface, and a plurality of second irregularities are located on a surface of the second light transmissive substrate, wherein the plurality of first irregularities are located directly on the second surface, and wherein the plurality of second irregularities are located directly on the surface of the second light transmissive substrate.

16. The light-emitting device according to claim 15, wherein
an interface between the first irregularities and the second irregularities includes one or more voids.

17. The light-emitting device according to claim 16, wherein the one or more voids comprise a volume formed between the first irregularity and the second irregularity.

18. The light-emitting device according to claim 15, wherein
first irregularities are positioned with regularity.

19. The light-emitting device according to claim 15, wherein
one or more vertexes of one or more of the first irregularities are in contact with the surface of the second light transmissive substrate.

* * * * *